United States Patent [19]

Yamauchi

[11] Patent Number: 5,400,280
[45] Date of Patent: Mar. 21, 1995

[54] NONVOLATILE MEMORY AND A METHOD OF WRITING DATA THERETO

[75] Inventor: Yoshimitsu Yamauchi, Yamatokoriyama, Japan

[73] Assignee: Sharp Kabushiki Kaisha, Osaka, Japan

[21] Appl. No.: 89,330

[22] Filed: Jul. 12, 1993

[30] Foreign Application Priority Data

Aug. 3, 1992 [JP] Japan .................. 4-206644

[51] Int. Cl.$^6$ .................................. G11C 11/40
[52] U.S. Cl. ............................ 365/185; 365/218
[58] Field of Search ............... 365/185, 218, 900; 257/315–322

[56] References Cited

U.S. PATENT DOCUMENTS

| | | | |
|---|---|---|---|
| 4,924,438 | 5/1990 | Kobatake | 365/185 |
| 5,088,060 | 2/1992 | Endoh | 365/185 |
| 5,278,439 | 1/1994 | Ma | 257/319 |
| 5,278,794 | 1/1994 | Tanaka | 365/185 |

Primary Examiner—Do Hyun Yoo
Assistant Examiner—A. Zarabian
Attorney, Agent, or Firm—Nixon & Vanderhye

[57] ABSTRACT

The present invention provides a nonvolatile memory and a method of writing data thereto. The nonvolatile memory includes a memory cell having a semiconductor substrate, a first electrode on the substrate formed through the intermediary of an insulating film, a floating gate adjacent to the first electrode formed through the intermediary of an insulating film, and a second electrode deposited at least on the floating gate through the intermediary of an insulating film, wherein a plurality of the memory cells are arranged in the directions of X and Y to form a matrix, at least 2 memory cells arranged in the direction of X form a memory cell group, a single first impurity diffused layer and a single second impurity diffused layer used in common in the respective cells are formed at the both ends of the memory cell group, and the first electrode and the second electrode of the plurality of memory cells arranged in the direction of Y are connected in common.

4 Claims, 3 Drawing Sheets

NONVOLATILE MEMORY AND A METHOD OF WRITING DATA THERETO

BACKGROUND OF THE INVENTION

1. Field of the Invention

The invention relates to a nonvolatile memory capable of high-density and a method of writing data thereto. More particularly, it relates to an EEPROM provided with a single source (a first impurity diffused layer) in common and a single drain (a second impurity diffused layer) in common for plurality of memory cells and a method of writing data thereto.

2. Description of the Related Art

A memory cell comprising a Si substrate provided with a source and drain, an auxiliary gate (AG) formed through the intermediary of an insulating film, a floating gate (FG) formed on the side wall of the AG through the intermediary of an insulating film, and a control gate (CG) provided on the FG and AG through the intermediary of the insulating films has been proposed. In a memory cell array having such memory cells arranged in matrix in the directions of X and Y, each memory cell is provided with a source and a drain.

This type of memory cell has a writing property as shown in FIG. 5.

In FIG. 5, the vertical axis shows a threshold voltage ($V_t$) after the data are written (after programming) and the horizontal axis shows an auxiliary gate voltage ($V_{AG}$). When the data were written, the applied voltage was 5V to the drain and 12V to the control gate for 5 μsec. When the data were erased, the applied voltage was 5V to the drain and 11V to the control gate for 5 msec.

FIG. 6 is an equivalent circuit diagram of the memory cell of this type.

SUMMARY OF THE INVENTION

The present invention provides a nonvolatile memory including a memory cell comprising a semiconductor substrate, a first electrode on the substrate formed through the intermediary of a gate insulating film, a floating gate adjacent to the first electrode formed through the intermediary of an insulating film, and a second electrode deposited at least on the floating gate through the intermediary of a first insulating film, wherein a plurality of the memory cells are arranged in the directions of X and Y to form a matrix, at least 2 memory cells arranged in the direction of X form a memory cell group, a first impurity diffused layer and a second impurity diffused layer for the respective cells are formed at the both ends of the memory cell group, and the first electrode and the second electrode of the plurality of memory cells arranged in the direction of Y are connected in common.

Further, the present invention provides a method of writing data to a desired memory cell of the memory cell group in the above nonvolatile memory comprising steps of applying a voltage approximate to a threshold voltage only to the first electrode of a memory cell to which the data is written, applying a voltage sufficiently higher than the threshold voltage to the first electrode of the other memory cell of the memory cell group including the memory cell to which data are written, and applying a prescribed voltage to the single second impurity diffused layer in common for the memory cell group.

DETAILED DESCRIPTION OF THE INVENTION

Figure 1:
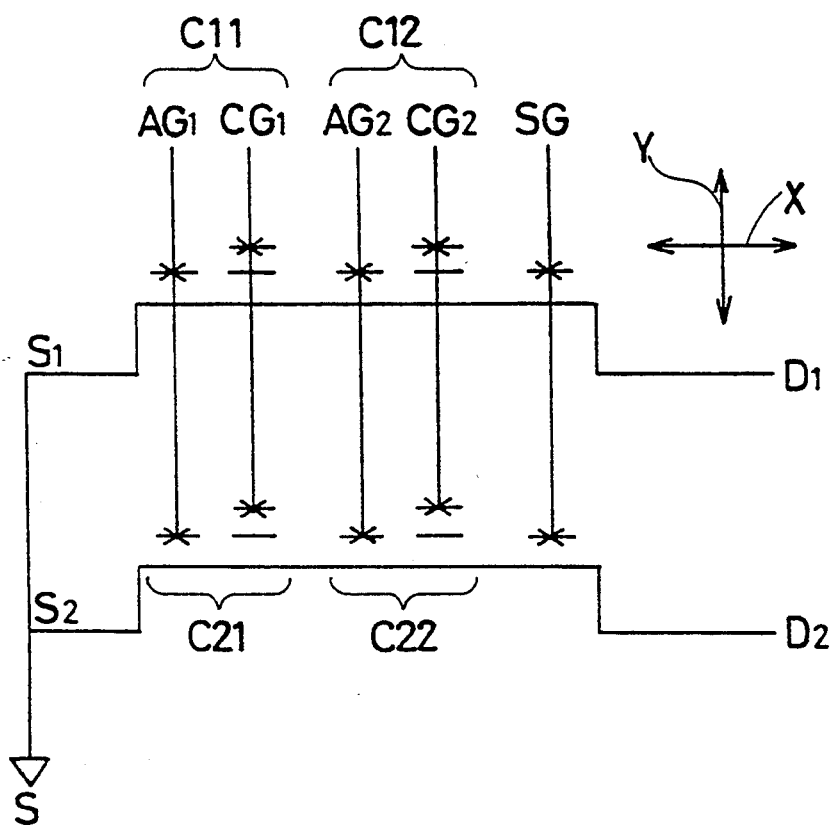
FIG. 1 is an equivalent circuit diagram for illustrating two memory cell groups of a nonvolatile memory cell of Example 1 of the present invention.

In a memory cell of a nonvolatile memory of the present invention, a first electrode functioning as an auxiliary gate (AG), a floating gate (FG), and a second electrode functioning as a control gate (CG) are formed on a semiconductor substrate. In a memory cell group composed of at least 2 memory cells adjacent to each other in the direction of X, the memory cells have the single first and second impurity diffused layers which are functioning as a first and second electrodes and used in common at the both ends of the memory cell group. Further, the memory cells adjacent to each other in the direction of Y have the single first electrode functioning as the auxiliary gate (AG) in common and the single second electrode functioning as the control gate (CG) in common.

In the nonvolatile memory cell of the present invention, it is preferred to use a compound semiconductor substrate or the like such as a silicon or GaAs substrate as the semiconductor substrate. The silicon substrate has an $SiO_2$ film with a thickness of about 100 to 140 angstrom or tunnel oxide film with a thickness of about 50 to 100 angstrom thereon as a gate insulating film. These insulating films can be formed by a known method, for example, by CVD method using $SiH_4$ or $SiH_2Cl_2$, etc. or by thermal oxidation.

On these insulating films, the first electrode is formed in the direction of Y as an auxiliary gate. The material of the first electrode is not particularly specified, but a polysilicon or a polycide which has a low resistance are preferred. The method of forming the polysilicon and polycide is not specified in particular, and can be formed by a conventional method such as CVD. The preferred thickness is about 1000 to 3000 angstrom for polysilicon and about 2000/1500 angstrom for polycide such as WSix/polysilicon. On the first electrode, an $SiO_2$ film is further deposited with a thickness of about 300 to 1000 angstrom.

The floating gate (FG) is formed on one side of the side wall of the first electrode through the intermediary of an insulating film. The insulating film sandwiched between the first electrode and the floating gate is preferably about 200 to 1000 angstrom in thickness. It is preferably composed of, for example, an ONO film consisting of $SiO_2/SiN/SiO_2$ deposited in this order. These insulating film can be also formed by a conventional method such as CVD. The material of the floating gate is not particularly specified, but polysilicon is preferred. The method of forming polysilicon is not specified in particular, and can be formed by a conventional methods such as CVD. The thickness of polysilicon in this case is preferably about 1500 to 6000 angstrom.

On the entire surface of the first electrode and the floating gate, an ONO film with a thickness of about 2000 angstrom in terms of $SiO_2$ is formed as a first insulating film. The insulating film can be deposited on the first electrode, and subsequently the floating gate can be formed. Alternatively, after forming the floating gate the insulating film can be deposited thereon, and subsequently the first electrode is formed. Alternatively, the first electrode and the floating gate are formed simultaneously and then the insulating film can be formed.

The control gate (CG), covering at least the floating gate through the intermediary of the first insulating film, and preferably covering a part of the first electrode, is formed in the direction of Y. The material of the control gate (CG) is not specified in particular, but polysilicon is preferable. The control gate is formed by the same method as described above for forming the floating gate.

In the nonvolatile memory, a source and a drain function as a first and a second impurity diffused layers which are used in common for each cell. The source and drain are formed at the both ends of a memory cell group composed of at least 2 memory cells adjacent to each other in the direction of X. The source and the drain are formed by a known method. For example, when a p-type semiconductor substrate is used, n-type impurities such as phosphorus and arsenic are induced into the substrate by ion implantation at about $1 \times 10^{13}$ to $1 \times 10^{15}$ ions/cm$^2$ at about 40 to 80 KeV.

As described above, in the nonvolatile memory cell of the present invention, a plurality of the memory cell groups which form the memory cell array have the single first impurity diffused layer and the single second impurity diffused layer used in common for each cell group, thereby realizing a small size memory cell array and obtaining a nonvolatile memory suitably permits the increase of its capacity (more than 64 mega).

The embodiment of the nonvolatile memory of the present invention will be described with reference to figures as follows:

Example 1

Figure 5:
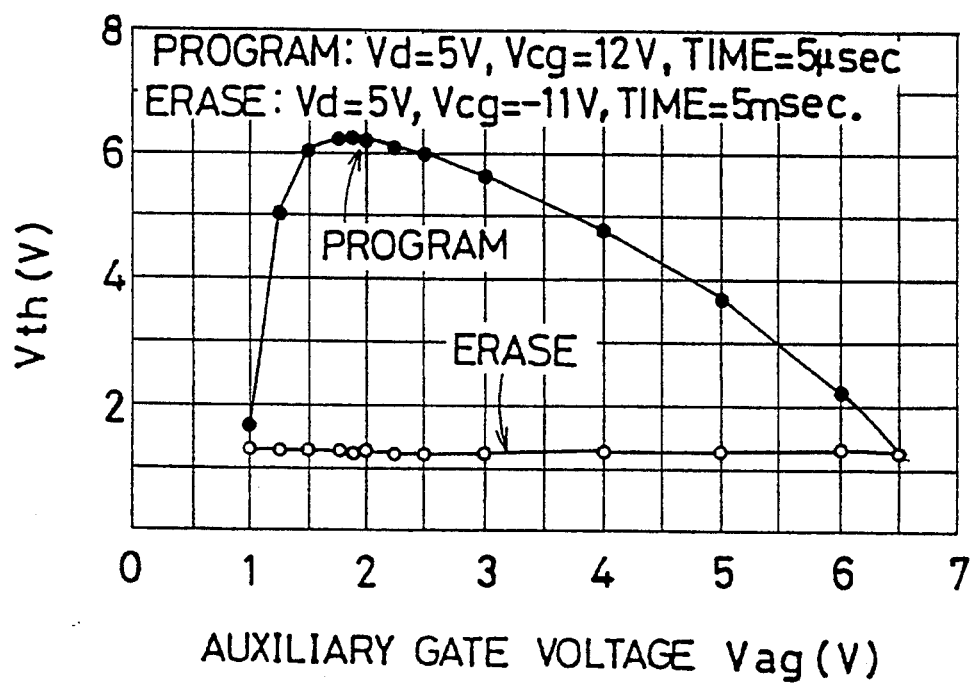
FIG. 5 shows a writing property of the memory cell used in Examples of the present invention.

As is shown in FIG. 1, two memory cell groups in a nonvolatile memory of the present invention are composed of a memory cell group consisting of memory cells C11 and C12 adjacent to each other and a memory cell group consisting of memory cells C21 and C22 adjacent to each other. The memory cells C11 and C12 employ a single first impurity diffused layer (source) $S_1$ and a single second impurity diffused layer (drain) $D_1$ in common, while the memory cells C21 and C22 employ a single first impurity diffused layer (source) $S_2$ and a single second impurity diffused layer (drain) $D_2$ in common. The sources $S_1$ and $S_2$ are connected and form a source line S. Between the two memory cell groups, a first electrode (AG$_1$) working as an auxiliary gate and a second electrode (CG$_1$) working as a control gate are used in common for C11 and C21 which are adjacent in the direction of Y, while another first electrode (AG$_2$) working as an auxiliary gate and another single second electrode (CG$_2$) working as a control gate are used in common for C12 and C22 which are also adjacent in the direction of Y, respectively. In addition, a selecting gate (SG) is formed for selecting either of the memory cell group having a single source and drain in common from the two memory cell groups. As shown in FIG. 5, the memory cells C11, C12, C21 and C22 have a writing property of varying a threshold value depending on the voltage VAG applied to AG.

Figure 2:
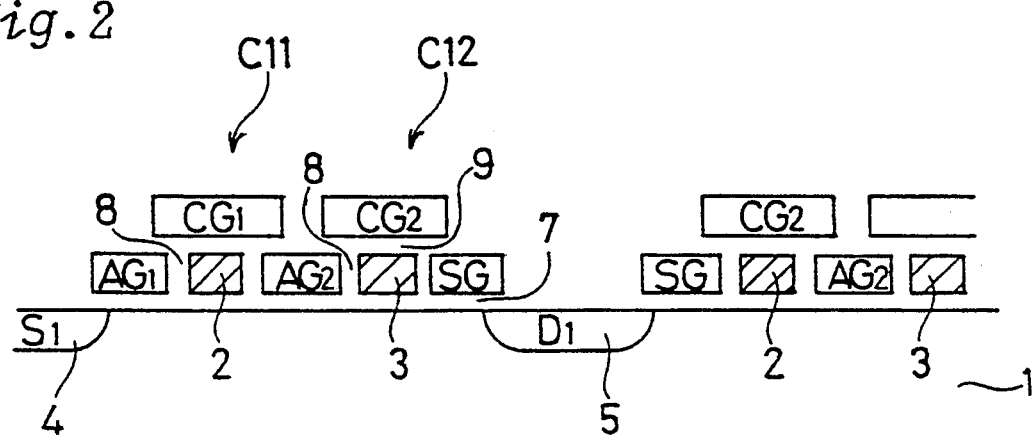
FIG. 2 is a cross-sectional view schematically showing the memory cell groups of Example 1 of the present invention.
Figure 3:
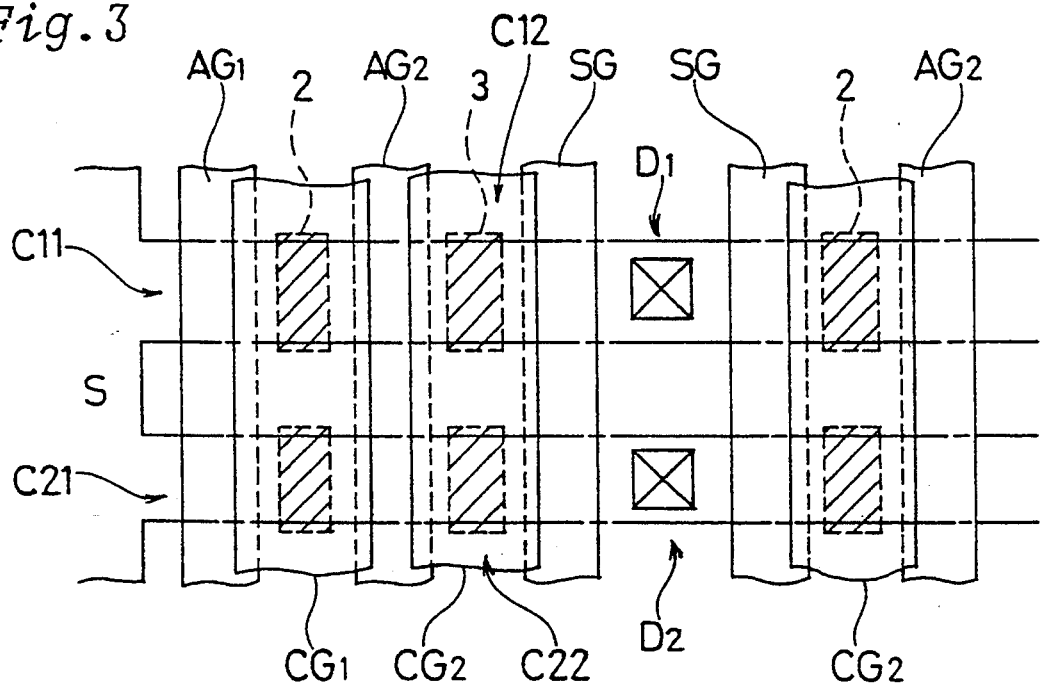
FIG. 3 is a plan view schematically showing the memory cell groups of Example 1 of the present invention.

As shown in FIGS. 2 and 3, the memory cell groups having the above structure were formed on a silicon substrate 1. The auxiliary gates (the first electrodes) AG$_1$ and AG$_2$ composed of polysilicon with a thickness of about 2000 angstrom were formed on the silicon substrate 1 through the intermediary of $SiO_2$ film 7 functions as a dielectric film having a thickness of about 80 angstrom. The floating gates 2 and 3 composed of polysilicon with a thickness of about 2000 angstrom was formed on each side wall of the auxiliary gates AG$_1$ and AG$_2$ through the intermediary of $SiO_2$ film 8 functions as a dielectric film having a thickness of 80 angstrom. The control gates (second electrodes) CG$_1$ and CG$_2$ composed of polysilicon with a thickness of about 2000 angstrom was formed at least on the floating gates 2 and 3 through the intermediary of $SiO_2$ film 7 with a thickness of about 100 angstrom which are formed on the whole surface of the floating gates 2 and 3 and the auxiliary gates AG$_1$ and AG$_2$ and functions as a dielectric film, thereby controlling the electric potential of the floating gates 2 and 3. In the nonvolatile memory thus obtained, the memory cells C11 and C12 and the memory cells C21 and C22 are arranged in the directions of X and Y so that the memory cells of (C11 and C12) and (C21 and C22) respectively arranged in the direction of X compose an each memory cell group. A common source 4 (a first impurity diffused layer) and a common drain 5 (a second impurity diffused layer) are formed at the both ends of the memory cell group. The auxiliary gates arranged in the direction of Y are connected in common, for example AG$_1$ of the memory cells C11 and C21 and AG$_2$ of the memory cells C12 and C22 are connected. Similarly, the control gates arranged in the direction of Y were connected in common, for example CG$_1$ of the memory cells C11 and C21 and CG$_2$ of the memory cells C12 and C22 are connected.

Next, a method of writing data of the nonvolatile memory is described.

For example, a low voltage of 2V approximate to a threshold voltage was applied only to AG$_1$ of the memory cell C11 to which the data were written, and a voltage of 7V was applied to the AG$_2$ of the memory cell C12 to which the date were not written. The data were written when 5V was applied to SG and a high voltage of about 12V was applied to CG$_1$ and CG$_2$. In this case, 5V was applied to the common drain D1, while the other drains may be grounded (0V).

TABLE 1

|  | AG1 | CG1 | AG2 | CG2 | SG | Unit: V D1 | D2 |
|---|---|---|---|---|---|---|---|
| Writing | 2 | 12 | 7 | 12 | 5 | 5 | 0 |
| Erasing | 0 | −12 | 5 | 12 | 5 | 5 | 0 |
| Reading | 5 | 5 | 5 | 12 | 5 | 3 | 0 |

In case of erasing the data written to C11, the applied voltage was: 5V to D$_1$ of the memory cell C11 from which data were erased, 0V to AG$_1$ (ground), a high voltage of about 12V to CG$_2$ of the memory cell C12 from which data were not erased, and a negative high voltage of −12V to CG$_1$, whereby electrons only in C11 were drawn out by Fowler-Nordheim tunneling from FG to D1 and the voltage of the cell $V_t$ was lowered.

If the data is read from the memory cell C11, the applied voltage is: 3V to $D_1$ of the memory cell C11 from which data were read, a high voltage of about 12V to $CG_2$ of the memory cell C12 from which data were not read, 5V to $AG_2$; and the cell was kept to be On state regardless of the voltage of the cell $V_t$ whether it is High or Low. The data were read out when 5V was applied to $AG_1$ and $CG_1$ of the memory cell C11.

Example 2

Figure 4:
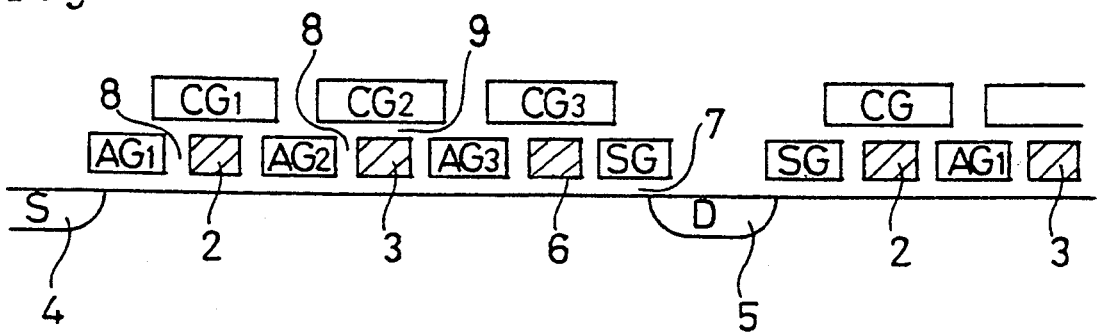
FIG. 4 is a cross-sectional view schematically showing three memory cell groups of Example 2 of the present invention an a other memory cell groups.

The nonvolatile memory of Example 2 was substantially the same as the nonvolatile memory described in Example 1 except that the memory cell group was consisted of three memory cells, while it was consisted of two memory cells in Example 1. The nonvolatile memory of this example is illustrated in FIG. 4.

Figure 6:
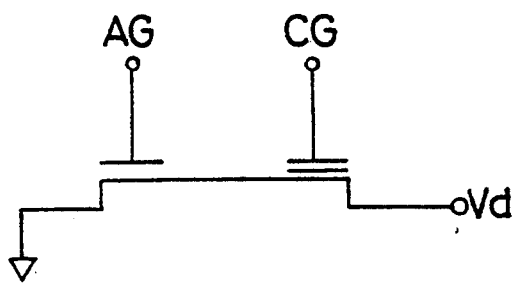
FIG. 6 is an equivalent circuit diagram of the conventional memory cell.

When data are written to selected cells having a source and drain for the respective memory cells as shown in FIG. 6, a high voltage of about 12V must be applied to CG and the channel region of the selected cell must be kept to be ON state (reverse mode). However, in case of using the nonvolatile memory of the present invention, it is possible to write data only when a voltage approximate to a threshold voltage is applied on the condition that a low voltage of 2V approximate to the threshold voltage is applied to selected cell among the memory cell group and keep AG of the other cells to be HIGH state because the single first and second impurity diffused regions in common are formed on the both ends of the memory cell group consisting of 2 or more memory cells arranged in the direction of X. Further, when writing data, the implanting efficiency can be made higher by inducing hot electrons from the source side, the drain voltage can be controlled to 5V or less, and large capacity can be realized with the drain which is supplied with an outside single power.

In addition, the conventional memory cell requires a pair of source and drain for each memory cell. However, the nonvolatile memory of the present invention requires only one set of the source and the drain region for a group of memory cells because a plurality of memory cells forming one memory cell group commonly employ a single first impurity diffused layer and a single second impurity diffused layer, thereby reducing the area of memory cell array.

The examples described herein are illustrative and not restrictive. Accordingly, it is not intended that the scope of claims appended hereto be limited to the description as set forth.

What we claimed is:

1. A nonvolatile memory including a memory cell comprising,
   a semiconductor substrate,
   a floating gate adjacent to the first electrode formed through the intermediary of an insulating film, and
   a second electrode deposited at least on the floating gate through the intermediary of a first insulating film; wherein
   a plurality of the memory cells arranged in the directions of X and Y to form a matrix, at least two memory cells arranged in the direction of X form a memory cell group, said memory cell group having only two impurity diffused layers comprising a single first impurity diffused layer and a single second impurity diffused layer used in common in the respective cells of the group, the first and second impurity diffused layers are each formed at opposite ends of the memory cell group and the first electrodes are commonly connected and the second electrodes are commonly connected for memory cells aligned in the direction of Y.

2. A nonvolatile memory including a memory cell comprising,
   a semiconductor substrate,
   a first electrode on the substrate formed through the intermediary of a gate insulating film,
   a floating gate adjacent to the first electrode formed through the intermediary of an insulating film, and
   a second electrode deposited at least on the floating gate through the intermediary of a first insulating film; wherein
   a plurality of the memory cells arranged in the directions of X and Y to form a matrix, at least two memory cells arranged in the direction of X form a memory cell group, said memory cell group having a single first impurity diffused layer and a second impurity diffused layer used in common in the respective cells of the group, the first and second impurity diffused layers are each formed at opposite ends of the memory cell group, and the first electrodes are commonly connected and the second electrodes are commonly connected for memories aligned in the direction of Y, in which only the first electrode of the memory cell to which data are written can be operated by an electric potential approximate to a threshold voltage and the first electrodes of the other memory cells in the memory group including the memory cell to which the data are written can be operated by an electric potential higher than the threshold voltage.

3. A method of writing data to a desired memory cell of the memory cell group in the nonvolatile memory including a memory cell comprising,
   a semiconductor substrate,
   a first electrode on the substrate formed through the intermediary of a gate insulating film,
   a floating gate adjacent to the first electrode formed through the imtermediary of a first insulating film; wherein
   a second electrode deposited at least on the floating gate through the intermediary of a first insulating film; wherein
   a plurality of the memory cells arranged in the directions of X and Y to form a matrix, at least two memory cells arranged in the direction of X form a memory cell group said memory cell group having a single first impurity diffused layer and a single second impurity diffused layer used in common in the respective cells of the group, the first and second impurity disused layers are each formed at opposite ends of memory cell group, and the first electrodes are commonly connected and the second electrodes are commonly connected for memory cells aligned in the direction of Y, comprising the steps of:
   applying a voltage approximate to a threshold voltage only to the first electrode of memory cell to which data is written,
   applying a voltage higher than the threshold voltage to the first electrodes of the other memory cells of the memory cell group including the memory cell to which the data is written, and
   applying a prescribed voltage to the single second impurity diffused layer in common of the memory cell group.

4. A method of writing data according to claim 3, the voltage applied to the second impurity diffused layer is a low voltage of 5V or less.

* * * * *